United States Patent
Takasu et al.

(10) Patent No.: US 10,186,555 B2
(45) Date of Patent: Jan. 22, 2019

(54) RADIATION DETECTOR

(71) Applicant: Kabushiki Kaisha Toshiba, Minato-ku (JP)

(72) Inventors: Isao Takasu, Setagaya (JP); Satomi Taguchi, Ota (JP); Atsushi Wada, Kawasaki (JP); Mitsuyoshi Kobayashi, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/686,299

(22) Filed: Aug. 25, 2017

(65) Prior Publication Data

US 2018/0277607 A1 Sep. 27, 2018

(30) Foreign Application Priority Data

Mar. 21, 2017 (JP) .................. 2017-055134

(51) Int. Cl.
*H01L 51/50* (2006.01)
*H01L 27/30* (2006.01)
*G01T 1/24* (2006.01)

(52) U.S. Cl.
CPC .............. *H01L 27/308* (2013.01); *G01T 1/24* (2013.01)

(58) Field of Classification Search
CPC ...................... H01L 51/42; H01L 51/5004
See application file for complete search history.

(56) References Cited

U.S. PATENT DOCUMENTS

2011/0095266 A1 4/2011 Hayden et al.
2012/0211741 A1 8/2012 Kato et al.
(Continued)

FOREIGN PATENT DOCUMENTS

JP  2011-119676 A   6/2011
JP  5460706 B2      4/2014
JP  2018-155720 A   10/2018

OTHER PUBLICATIONS

G. N. Ankah, et al., "PbS Quantum Dot Based Hybrid-Organic Photodetectors for X-ray Sensing", Organic Electronics, vol. 33, 2016, pp. 201-206.
(Continued)

*Primary Examiner* — Jae Lee
(74) *Attorney, Agent, or Firm* — Oblon, McClelland, Maier & Neustadt, L.L.P.

(57) ABSTRACT

According to one embodiment, a radiation detector includes a first conductive layer, a second conductive layer, and an intermediate layer. The intermediate layer is provided between the first and second conductive layers. The intermediate layer includes an organic semiconductor region and a plurality of particles. The organic semiconductor region includes a portion provided around the particles. The organic semiconductor region includes first and second semiconductor regions. The first semiconductor region has a first highest occupied molecular orbital and a first lowest unoccupied molecular orbital. The second semiconductor region has a second highest occupied molecular orbital and a second lowest unoccupied molecular orbital. The particles have a third highest occupied molecular orbital and a third lowest unoccupied molecular orbital. The first highest occupied molecular orbital is lower than the third highest occupied molecular orbital. The second lowest unoccupied molecular orbital is higher than the third lowest unoccupied molecular orbital.

8 Claims, 3 Drawing Sheets

(56) References Cited

U.S. PATENT DOCUMENTS

2017/0025630 A1\* 1/2017 Seo .................... C07F 15/0033
2018/0277779 A1   9/2018 Takasu et al.

OTHER PUBLICATIONS

M. Dolores Perez, et al,, "Molecular and Morphological Influences on the Open Circuit Voltages of Organic Photovoltaic Devices", Journal of American Chemical Society, vol. 131 No. 26, 2009, pp. 9281-9286.

\* cited by examiner

RADIATION DETECTOR

CROSS-REFERENCE TO RELATED APPLICATIONS

This application is based upon and claims the benefit of priority from Japanese Patent Application No. 2017-055134, filed on Mar. 21, 2017; the entire contents of which are incorporated herein by reference.

FIELD

Embodiments described herein relate generally to a radiation detector.

BACKGROUND

It is desirable to increase the precision of a radiation detector.

DETAILED DESCRIPTION

Figure 1A:
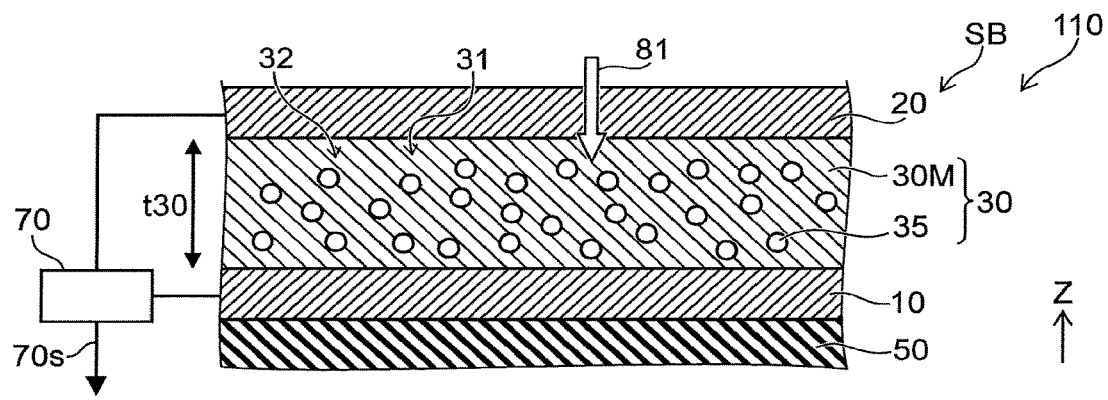
FIG. 1A to FIG. 1C are schematic views illustrating a radiation detector according to a first embodiment.

According to one embodiment, a radiation detector includes a first conductive layer, a second conductive layer, and an intermediate layer. The intermediate layer is provided between the first conductive layer and the second conductive layer. The intermediate layer includes an organic semiconductor region and a plurality of particles. The organic semiconductor region includes a portion provided around the particles. The organic semiconductor region includes a first semiconductor region and a second semiconductor region. The first semiconductor region has a first highest occupied molecular orbital and a first lowest unoccupied molecular orbital. The second semiconductor region has a second highest occupied molecular orbital and a second lowest unoccupied molecular orbital. The particles have a third highest occupied molecular orbital and a third lowest unoccupied molecular orbital. The first highest occupied molecular orbital is lower than the third highest occupied molecular orbital. The second lowest unoccupied molecular orbital is higher than the third lowest unoccupied molecular orbital. The absolute value of a difference between the third highest occupied molecular orbital and the third lowest unoccupied molecular orbital is less than the absolute value of a difference between the second highest occupied molecular orbital and the third lowest unoccupied molecular orbital and less than the absolute value of a difference between the third highest occupied molecular orbital and the first lowest unoccupied molecular orbital.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
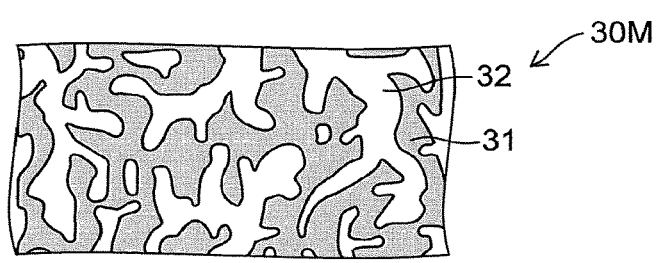
Figure 1C:
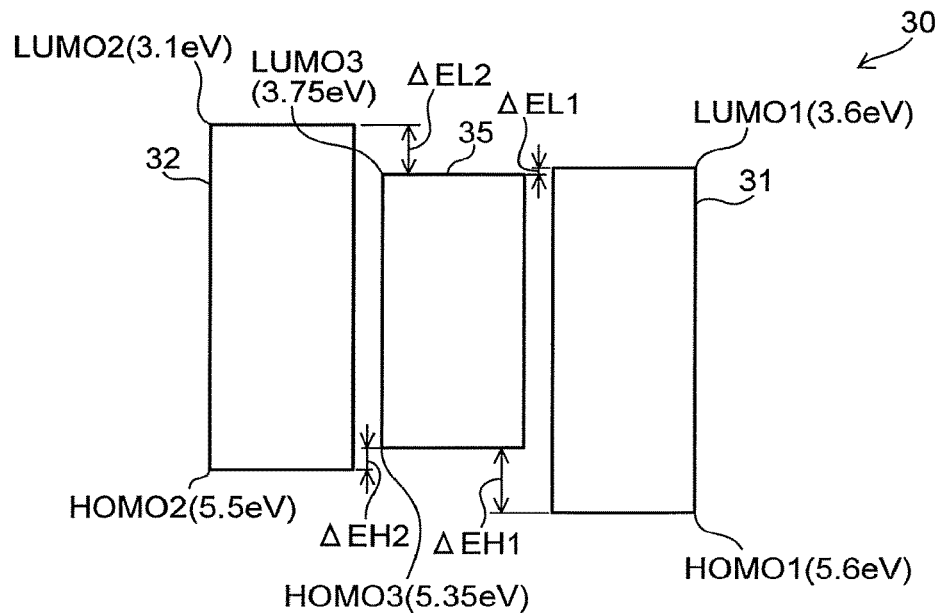

FIG. 1A to FIG. 1C are schematic views illustrating a radiation detector according to a first embodiment.

FIG. 1A is a cross-sectional view. FIG. 1B is a schematic cross-sectional view illustrating a portion of the radiation detector. FIG. 1C is a schematic view illustrating the energy levels of the radiation detector.

As shown in FIG. 1A, the radiation detector 110 according to the first embodiment includes a first conductive layer 10, a second conductive layer 20, and an intermediate layer 30.

The intermediate layer 30 is provided between the first conductive layer 10 and the second conductive layer 20. A substrate 50 is provided in the example. The first conductive layer 10 is positioned between the substrate 50 and the second conductive layer 20.

A direction from the second conductive layer 20 toward the first conductive layer 10 is taken as a Z-axis direction. The Z-axis direction is the stacking direction of the first conductive layer 10, the intermediate layer 30, and the second conductive layer 20. These layers spread along a plane that is substantially perpendicular to the Z-axis direction. The first conductive layer 10, the second conductive layer 20, and the intermediate layer 30 are included in a stacked body SB.

The intermediate layer 30 includes an organic semiconductor region 30M and multiple particles 35. The organic semiconductor region 30M includes a portion provided around the multiple particles 35. For example, the multiple particles 35 are dispersed in the organic semiconductor region 30M. At least two of the multiple particles 35 may be separated from each other. At least two of the multiple particles 35 may contact each other. For example, the organic semiconductor region 30M surrounds the periphery of at least a portion of the multiple particles 35. A portion of one of the multiple particles 35 may be exposed from the organic semiconductor region 30M.

For example, PbS or the like is used as the multiple particles 35. Other examples of the multiple particles 35 are described below.

The organic semiconductor region 30M includes an organic semiconductor material. The organic semiconductor region 30M includes, for example, a first semiconductor region 31 and a second semiconductor region 32.

FIG. 1B illustrates the organic semiconductor region 30M. The first semiconductor region 31 and the second semiconductor region 32 are mixed with each other in the example. The first semiconductor region 31 and the second semiconductor region 32 may be stacked with each other. The organic semiconductor region 30M may have, for example, a bulk heterojunction structure.

The first semiconductor region 31 includes, for example, boron subphthalocyanine chloride (SubPc). In such a case, the first semiconductor region 31 is of the n-type. The second semiconductor region 32 includes, for example, poly(9,9-dioctylfluorene-alt-bithiophene) (F8T2). In such a case, the second semiconductor region 32 is of the p-type. Other examples of the organic semiconductor region 30M are described below.

A detection circuit 70 is provided as shown in FIG. 1A. The detection circuit 70 is electrically connected to the first conductive layer 10 and the second conductive layer 20. The detection circuit 70 applies a bias voltage between the first conductive layer 10 and the second conductive layer 20.

Radiation 81 is incident on a stacked body SB. At least one of the first conductive layer 10 or the second conductive layer 20 is transmissive to the radiation 81. In the example, the radiation 81 is incident on the intermediate layer 30 via the second conductive layer 20. A movable charge is generated in the intermediate layer 30 by excitation due to the radiation 81. The charge is moved by the bias voltage toward the first conductive layer 10 or the second conductive layer 20. A signal (e.g., a current signal) that accompanies the movement of the charge is detected by the detection circuit 70. The detection circuit 70 is configured to output a signal 70s corresponding to the intensity of the radiation 81 incident on the stacked body SB.

The radiation 81 includes, for example, at least one of α-rays, β-rays, or γ-rays.

As shown in FIG. 1C, the first semiconductor region 31 has a first highest occupied molecular orbital HOMO1 and a first lowest unoccupied molecular orbital LUMO1. The second semiconductor region 32 has a second highest occupied molecular orbital HOMO2 and a second lowest unoccupied molecular orbital LUMO2. The multiple particles 35 have a third highest occupied molecular orbital HOMO3 and a third lowest unoccupied molecular orbital LUMO3.

In the embodiment, the first highest occupied molecular orbital HOMO1 is lower than the third highest occupied molecular orbital HOMO3. The second lowest unoccupied molecular orbital LUMO2 is higher than the third lowest unoccupied molecular orbital LUMO3.

The absolute value of the difference between the third highest occupied molecular orbital HOMO3 and the third lowest unoccupied molecular orbital LUMO3 is less than the absolute value of the difference between the second highest occupied molecular orbital HOMO2 and the third lowest unoccupied molecular orbital LUMO3. The absolute value of the difference between the third highest occupied molecular orbital HOMO3 and the third lowest unoccupied molecular orbital LUMO3 is less than the absolute value of the difference between the third highest occupied molecular orbital HOMO3 and the first lowest unoccupied molecular orbital LUMO1. The absolute value of the difference between the third highest occupied molecular orbital HOMO3 and the third lowest unoccupied molecular orbital LUMO3 is less than the absolute value of the difference between the second highest occupied molecular orbital HOMO2 and the first lowest unoccupied molecular orbital LUMO1.

For example, the first lowest unoccupied molecular orbital LUMO1 is higher than the third lowest unoccupied molecular orbital LUMO3. The second highest occupied molecular orbital HOMO2 is lower than the third highest occupied molecular orbital HOMO3.

For example, in the case where the first semiconductor region 31 includes SubPc as recited above, the first highest occupied molecular orbital HOMO1 is 5.6 eV; and the first lowest unoccupied molecular orbital LUMO1 is 3.6 eV. The second highest occupied molecular orbital HOMO2 is 5.5 eV; and the second lowest unoccupied molecular orbital LUMO2 is 3.1 eV. The third highest occupied molecular orbital HOMO3 is 5.1 eV; and the third lowest unoccupied molecular orbital LUMO3 is 3.5 eV.

As described below, for example, dark current can be suppressed by such a relationship of energy levels.

For example, there is a reference example in which the intermediate layer 30 includes the multiple particles 35. In the reference example, PbS is used as the multiple particles 35. In such a case, (6,6)-phenyl-$C_{61}$-butyric acid methyl ester (PCBM) is used as the first semiconductor region 31; and poly(3-hexylthiophene) (P3HT) is used as the second semiconductor region 32. In the reference example, the first highest occupied molecular orbital HOMO1 is 5.9 eV; and the first lowest unoccupied molecular orbital LUMO1 is 3.7 eV. The second highest occupied molecular orbital HOMO2 is 4.7 eV; and the second lowest unoccupied molecular orbital LUMO2 is 2.7 eV. The third highest occupied molecular orbital HOMO3 is 5.1 eV; and the third lowest unoccupied molecular orbital LUMO3 is 3.5 eV.

In the reference example, the first highest occupied molecular orbital HOMO1 is lower than the third highest occupied molecular orbital HOMO3. The second lowest unoccupied molecular orbital LUMO2 is higher than the third lowest unoccupied molecular orbital LUMO3. However, the absolute value of the difference between the third highest occupied molecular orbital HOMO3 and the third lowest unoccupied molecular orbital LUMO3 is greater than the absolute value of the difference between the second highest occupied molecular orbital HOMO2 and the third lowest unoccupied molecular orbital LUMO3.

In such a reference example, it was found that the dark current is large. For example, charge (e.g., electrons) moves easily from the second highest occupied molecular orbital HOMO2 toward the third lowest unoccupied molecular orbital LUMO3. For example, charge (e.g., electrons) moves easily from the third highest occupied molecular orbital HOMO3 toward the first lowest unoccupied molecular orbital LUMO1. For example, charge (e.g., electrons) moves easily from the second highest occupied molecular orbital HOMO2 toward the first lowest unoccupied molecular orbital LUMO1. It is considered that such movement of the charge is due to thermal excitation. It is considered that the dark current becomes large due to such movement of the charge.

Conversely, in the embodiment, the absolute value of the difference between the third highest occupied molecular orbital HOMO3 and the third lowest unoccupied molecular orbital LUMO3 is less than the absolute value of the difference between the second highest occupied molecular orbital HOMO2 and the third lowest unoccupied molecular orbital LUMO3. In other words, the difference between the second highest occupied molecular orbital HOMO2 and the third lowest unoccupied molecular orbital LUMO3 is larger than the bandgap of the multiple particles 35. Thereby, for example, the movement of the charge from the second highest occupied molecular orbital HOMO2 toward the third lowest unoccupied molecular orbital LUMO3 is suppressed.

In the embodiment, the absolute value of the difference between the third highest occupied molecular orbital HOMO3 and the third lowest unoccupied molecular orbital LUMO3 is less than the absolute value of the difference between the third highest occupied molecular orbital HOMO3 and the first lowest unoccupied molecular orbital LUMO1. In other words, the difference between the third highest occupied molecular orbital HOMO3 and the first lowest unoccupied molecular orbital LUMO1 is larger than the bandgap of the multiple particles 35. Thereby, the movement of the charge from the third highest occupied molecular orbital HOMO3 toward the first lowest unoccupied molecular orbital LUMO1 is suppressed.

In the embodiment, the absolute value of the difference between the third highest occupied molecular orbital HOMO3 and the third lowest unoccupied molecular orbital LUMO3 is less than the absolute value of the difference between the second highest occupied molecular orbital HOMO2 and the first lowest unoccupied molecular orbital LUMO1. In other words, the difference between the second highest occupied molecular orbital HOMO2 and the first lowest unoccupied molecular orbital LUMO1 is larger than the bandgap of the multiple particles 35. Thereby, the movement of the charge from the second highest occupied molecular orbital HOMO2 toward the first lowest unoccupied molecular orbital LUMO1 is suppressed.

According to the embodiment, for example, the movement of the charge due to thermal excitation is suppressed; and the dark current is suppressed. According to the embodiment, a radiation detector can be provided in which the precision can be increased.

As shown in FIG. 1C, the difference between the first lowest unoccupied molecular orbital LUMO1 and the third lowest unoccupied molecular orbital LUMO3 is taken as a difference $\Delta EL1$. The absolute value of the difference $\Delta EL1$ is small. On the other hand, the difference between the second lowest unoccupied molecular orbital LUMO2 and the third lowest unoccupied molecular orbital LUMO3 is taken as a difference $\Delta EL2$. The absolute value of the difference $\Delta EL2$ is large. For example, the absolute value of the difference $\Delta EL1$ is less than the absolute value of the difference $\Delta EL2$. By setting the absolute value of the difference $\Delta EL1$ to be small, the resistance to the movement of the charge (the electrons) from the third lowest unoccupied molecular orbital LUMO3 toward the first lowest unoccupied molecular orbital LUMO1 can be low.

As shown in FIG. 1C, the difference between the second highest occupied molecular orbital HOMO2 and the third highest occupied molecular orbital HOMO3 is taken as a difference $\Delta EH2$. The absolute value of the difference $\Delta EH2$ is small. On the other hand, the difference between the first highest occupied molecular orbital HOMO1 and the third highest occupied molecular orbital HOMO3 is taken as a difference $\Delta EH1$. The absolute value of the difference $\Delta EH1$ is large. For example, the absolute value of the difference $\Delta EH2$ is less than the absolute value of the difference $\Delta EH1$. By setting the absolute value of the difference $\Delta EH2$ to be small, the resistance to the movement of the charge (the electrons) from the third highest occupied molecular orbital HOMO3 toward the second highest occupied molecular orbital HOMO2 can be low.

Information that relates to the first highest occupied molecular orbital HOMO1, the first lowest unoccupied molecular orbital LUMO1, the second highest occupied molecular orbital HOMO2, the second lowest unoccupied molecular orbital LUMO2, the third highest occupied molecular orbital HOMO3, and the third lowest unoccupied molecular orbital LUMO3 recited above is obtained, for example, as follows. For example, the organic semiconductor region 30M is dissolved using a solvent such as chlorobenzene, etc., and is recovered. After drying, the three components, i.e., the particles, the n-type semiconductor, and the p-type semiconductor, are separated by utilizing multiple solvents having different solubilities. A film is formed on a substrate for each of the three components. A method such as, for example, coating, etc., may be used to form the films. The separated components can be classified by measuring the absorption spectrum of each solution or the nuclear magnetic resonance spectrum of each solution. The energy levels of HOMO1, HOMO2, and HOMO3 are obtained by analyzing the films of the three components using photoelectron spectroscopy. On the other hand, the energy-gap energy is calculated from the absorption wavelength of the absorption spectrum for each of the films of the three components. LUMO1, LUMO2, and LUMO3 are derived from the sum of the values of the energy levels of HOMO1, HOMO2, and HOMO3 and the energy-gap energies of each of the three components.

Figure 2:
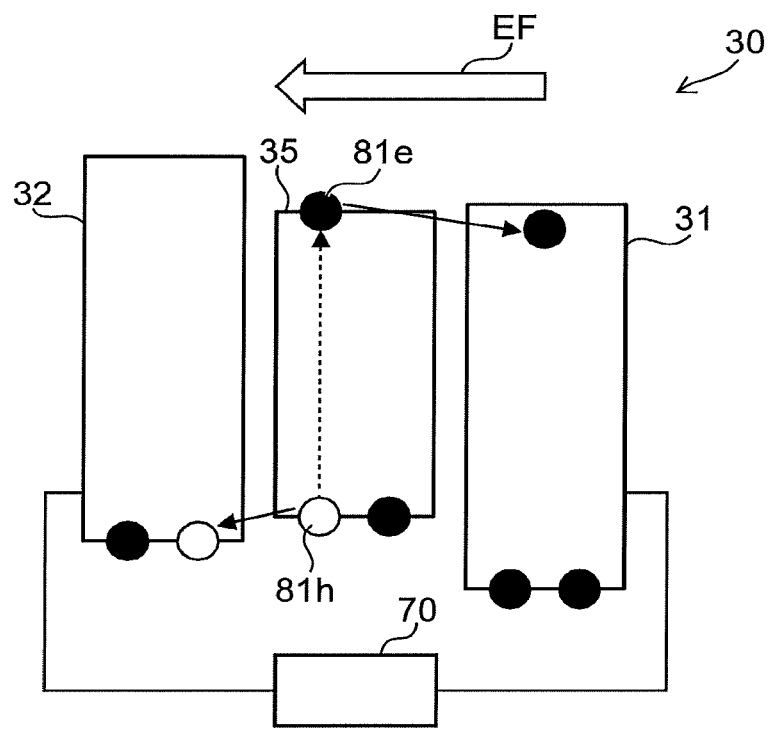
FIG. 2 is a schematic view illustrating an operation of the radiation detector according to the first embodiment.

FIG. 2 is a schematic view illustrating an operation of the radiation detector according to the first embodiment.

As shown in FIG. 2, an electric field EF is applied to the organic semiconductor region 30M. The electric field EF is based on the bias voltage applied from the detection circuit 70. For example, the radiation 81 is irradiated on the multiple particles 35. Due to the radiation 81, the multiple particles 35 are excited; and charge (e.g., electrons 81$e$ and holes 81$h$) are generated. These charges are moved by the electric field EF. For example, the electrons 81$e$ move from the multiple particles 35 toward the first semiconductor region 31. For example, the holes 81$h$ move from the multiple particles 35 toward the second semiconductor region 32. These charges are extracted via the first conductive layer 10 and the second conductive layer 20. The signal 70$s$ that corresponds to the intensity of the radiation 81 is output from the detection circuit 70.

There are cases where charge is generated by thermal excitation as recited above even when the radiation 81 is not incident. Thereby, there are cases where the dark current becomes large. In the embodiment, the energy levels of the first semiconductor region 31, the second semiconductor region 32, and the multiple particles 35 have a relationship such as that recited above. Thereby, the dark current can be suppressed as described above.

In the embodiment, the multiple particles 35 include, for example, at least one selected from the group consisting of PbS, PbSe, $Bi_2O_3$, and $Bi_2S_3$. Due to the bandgap energies of these materials, the selection range of the materials of the first semiconductor region 31 and the second semiconductor region 32 widens.

In the embodiment, the diameter of at least a portion of the multiple particles 35 is not less than 1 nanometer (nm) and not more than 100 nm. The multiple particles 35 are, for example, "nanoparticles."

As recited above, the diameters of the multiple particles 35 are small and are not less than 1 nm and not more than 100 nm. For example, the charge that is excited moves to the adjacent organic semiconductor before light emission. Thereby, the light emission based on the energy of the excitation of the particles 35 is suppressed.

For example, there is a reference example in which a material such as ZnS or the like is used as the scintillator layer. In the reference example, such a scintillator layer and a semiconductor layer (a photoelectric conversion layer) are stacked. Light emission occurs in the scintillator layer when radiation is irradiated on the scintillator layer. The emitted light is incident on the semiconductor layer. The emitted light is converted into an electrical signal in the semiconductor layer. In such a reference example, the two processes of light emission and photoelectric conversion occur. Energy loss occurs due to light emission and absorption. Therefore, the increase of the efficiency is limited.

Conversely, in the embodiment, the diameters of the multiple particles 35 are extremely small. Therefore, the light emission is suppressed. Thereby, a high efficiency is obtained.

In the embodiment, for example, the movement of the charge from the multiple particles 35 into the organic semiconductor region 30M occurs when the radiation 81 is incident on the stacked body SB. The movement of the charge is direct. For example, the processes that include light emission and absorption substantially do not occur. A high efficiency is obtained.

Figure 3:
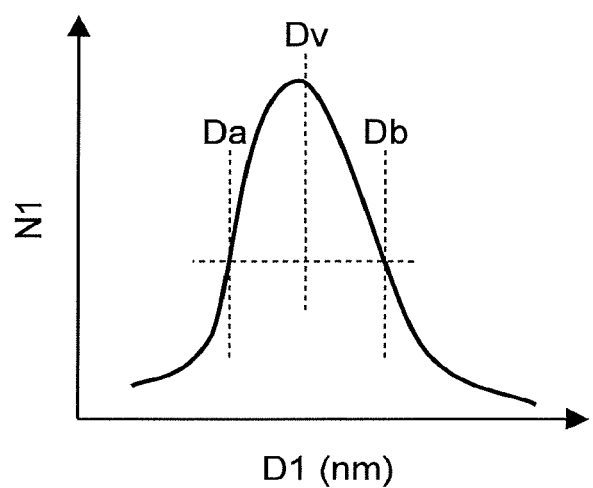
FIG. 3 is a graph illustrating a characteristic of some of the components of the radiation detector according to the first embodiment.

FIG. 3 is a graph illustrating a characteristic of some of the components of the radiation detector according to the first embodiment.

FIG. 3 shows the distribution of the diameters of the multiple particles 35 of the radiation detector 110 according to the embodiment. The horizontal axis of FIG. 3 is a diameter D1 (nanometers). The vertical axis is a number N1 (the count). The diameter D1 has a distribution as shown in FIG. 3. The distribution of the diameter D1 has an average value Dv. For example, in the embodiment, the average value Dv of the diameter D1 of the multiple particles 35 is not less than 1 nm and not more than 100 nm. For example, a value that is ½ of the maximum value of the number N1 is obtained at a diameter Da and a diameter Db. The diameter Da is smaller than the average value Dv; and the diameter Db is larger than the average value Dv. In the embodiment, the diameter Db may be greater than 100 nm. The diameter Db may be, for example, 500 nm or less. In the embodiment, the diameter Da may be less than 1 nm. The diameter Da may be, for example, 0.6 nm or more.

In the embodiment, there are cases where the particle 35 is substantially a sphere. In such a case, the diameter D1 corresponds to the diameter of a sphere. In the embodiment, the length of the particle 35 in one direction may be different from the length of the particle 35 in another direction. In such a case, the diameter D1 may be the arithmetic average of the length in the one direction and the length in the other direction.

In the embodiment, a thickness t30 of the intermediate layer 30 (referring to the drawings) is, for example, not less than 1 micrometer (μm) and not more than 1000 micrometers (μm). Thereby, the bias voltage can be low; and the formation of the intermediate layer 30 also is easy. By being thin, for example, the increase of the sensitivity to γ-rays can be suppressed. The thickness t30 of the intermediate layer 30 is the length of the intermediate layer 30 along the Z-axis direction (a first direction from the first conductive layer 10 toward the second conductive layer 20).

In the embodiment, the first conductive layer 10 and the second conductive layer 20 include, for example, metal oxide films. These conductive layers may include, for example, light-transmissive metal films. These conductive layers include, for example, at least one selected from the group consisting of indium oxide, zinc oxide, tin oxide, indium tin oxide (ITO), and fluorine-doped tin oxide (FTO). These conductive layers include at least one selected from the group consisting of gold, platinum, silver, copper, and aluminum. These conductive layers may include an alloy including at least one selected from the group consisting of gold, platinum, silver, copper, and aluminum. The thicknesses of the first conductive layer 10 and the second conductive layer 20 each are, for example, not less than 10 nm and not more than 1000 nm.

In the embodiment, the substrate 50 includes, for example, at least one selected from the group consisting of glass, a resin, and a metal. The thickness of the substrate 50 is, for example, not less than 10 μm and not more than 10 cm.

For example, the first conductive layer 10 is formed on the substrate 50; and a material that is used to form the intermediate layer 30 is, for example, coated onto the first conductive layer 10. Subsequently, this material is solidified. Thereby, the intermediate layer 30 is obtained. The second conductive layer 20 is formed on the intermediate layer 30. Thereby, the radiation detector 110 is obtained.

Figure 4:
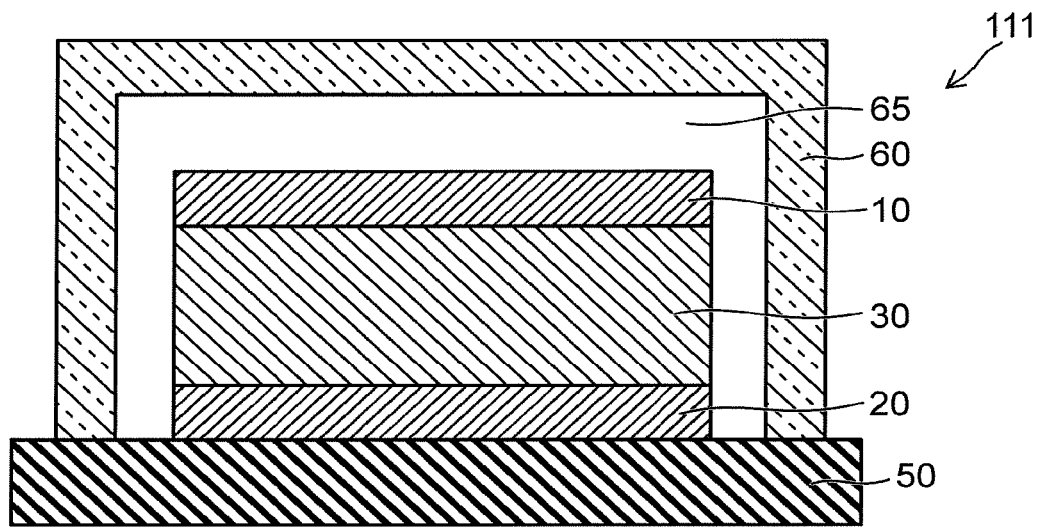
FIG. 4 is a schematic cross-sectional view illustrating another radiation detector according to the first embodiment.

FIG. 4 is a schematic cross-sectional view illustrating another radiation detector according to the first embodiment.

In the other radiation detector 111 according to the embodiment as shown in FIG. 4, a sealing member 60 is further provided in addition to the first conductive layer 10, the second conductive layer 20, the intermediate layer 30, and the substrate 50. The substrate 50 and the sealing member 60 include, for example, glass. The outer edge of the sealing member 60 is bonded to the outer edge of the substrate 50. The first conductive layer 10, the second conductive layer 20, and the intermediate layer 30 are provided in the space surrounded with the substrate 50 and the sealing member 60. The first conductive layer 10, the second conductive layer 20, and the intermediate layer 30 are sealed airtightly by the substrate 50 and the sealing member 60. Thereby, stable characteristics are obtained easily. High reliability is obtained.

A space 65 is provided between the sealing member 60 and the first conductive layer 10, between the sealing member 60 and the second conductive layer 20, and between the sealing member 60 and the intermediate layer 30. For example, an inert gas (e.g., a nitrogen gas, etc.) is sealed in the space 65.

Second Embodiment

Figure 5:
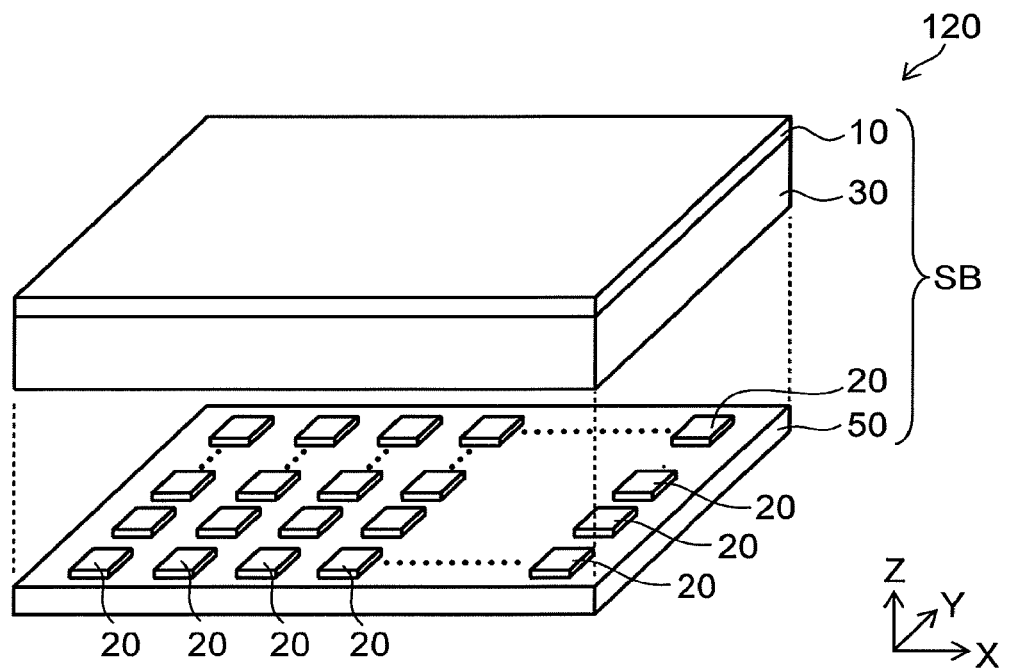
FIG. 5 is a schematic cross-sectional view illustrating a radiation detector according to a second embodiment.

FIG. 5 is a schematic cross-sectional view illustrating a radiation detector according to a second embodiment.

As shown in FIG. 5, the first conductive layer 10, the second conductive layer 20, and the intermediate layer 30 are provided in the radiation detector 120. The substrate 50 may be further provided. In FIG. 5, some of the components included in the radiation detector 120 are drawn as being separated from each other for easier viewing of the drawing.

The second conductive layer 20 is multiply provided in the radiation detector 120. The multiple second conductive layers 20 are arranged along a plane (e.g., the X-Y plane) crossing the first direction (the Z-axis direction) from one of the multiple second conductive layers 20 toward the first conductive layer 10. The X-Y plane is perpendicular to the Z-axis direction.

For example, the multiple second conductive layers 20 are arranged along an X-axis direction and a Y-axis direction. For example, the multiple second conductive layers 20 are arranged in a matrix configuration.

An image that corresponds to the radiation 81 is obtained in the radiation detector 120. The configurations described in reference to the first embodiment and modifications of the configurations are applicable to the radiation detector 120. In the radiation detector 120 as well, a radiation detector can be provided in which the precision can be increased.

For example, the radiation detector according to the embodiment may be utilized as a β-ray detector. For example, the β-ray detector converts β-rays into charge.

When detecting a contaminated state due to radiation, the detection of β-rays is useful to determine the contaminated state of a surface. β-ray detectors include detectors having small detection surface areas such as a Geiger-Mueller detector, etc. The measurement time is long for such a β-ray detector to measure a large object having a large surface area. It is easy for unmeasured locations to occur.

Compared to a radiation detector using an inorganic material, a radiation detector that uses an organic material is advantageous when increasing the surface area. The atomic numbers of elements included in organic materials are small. Therefore, the trap efficiency is low for radiation such as β-rays, γ-rays, etc. Therefore, the thickness of the layer of the organic material is set to be thick. It is difficult to obtain a thick and uniform layer of an organic material.

In the embodiment, the multiple particles 35 are provided in the layer of the organic material. Thereby, a high trap efficiency of the radiation is obtained using a thick and uniform layer. According to the embodiment, the β-rays can be detected with good selectivity. The dark current can be suppressed.

According to the embodiments, a radiation detector can be provided in which the precision can be increased.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor, etc.) is provided in a path between two conductors so that a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, intermediate layers, substrates, particles, organic semiconductor regions, first semiconductor regions, second semiconductor regions, detection circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a first conductive layer;
a second conductive layer; and
an intermediate layer provided between the first conductive layer and the second conductive layer, the intermediate layer including an organic semiconductor region and a plurality of particles, the organic semiconductor region including a portion provided around the particles, the organic semiconductor region including a first semiconductor region and a second semiconductor region, the first semiconductor region having a first highest occupied molecular orbital and a first lowest unoccupied molecular orbital, the second semiconductor region having a second highest occupied molecular orbital and a second lowest unoccupied molecular orbital, the particles having a third highest occupied molecular orbital and a third lowest unoccupied molecular orbital, the first highest occupied molecular orbital being lower than the third highest occupied molecular orbital, the second lowest unoccupied molecular orbital being higher than the third lowest unoccupied molecular orbital, the absolute value of a difference between the third highest occupied molecular orbital and the third lowest unoccupied molecular orbital being less than the absolute value of a difference between the second highest occupied molecular orbital and the third lowest unoccupied molecular orbital and less than the absolute value of a difference between the third highest occupied molecular orbital and the first lowest unoccupied molecular orbital,
wherein
the first lowest unoccupied molecular orbital is higher than the third lowest unoccupied molecular orbital, and
the second highest occupied molecular orbital is lower than the third highest occupied molecular orbital.

2. The detector according to claim 1, wherein the absolute value of a difference between the first lowest unoccupied molecular orbital and the third lowest unoccupied molecular orbital is less than the absolute value of a difference between the second lowest unoccupied molecular orbital and the third lowest unoccupied molecular orbital.

3. The detector according to claim 1, wherein the absolute value of a difference between the second highest occupied molecular orbital and the third highest occupied molecular orbital is less than the absolute value of a difference between the first highest occupied molecular orbital and the third highest occupied molecular orbital.

4. A radiation detector, comprising:
a first conductive layer;
a second conductive layer; and
an intermediate layer provided between the first conductive layer and the second conductive layer, the intermediate layer including an organic semiconductor region and a plurality of particles, the organic semiconductor region including a portion provided around the particles, the organic semiconductor region including a first semiconductor region and a second semiconductor region, the first semiconductor region having a first highest occupied molecular orbital and a first lowest unoccupied molecular orbital, the second semiconductor region having a second highest occupied molecular orbital and a second lowest unoccupied molecular orbital, the particles having a third highest occupied molecular orbital and a third lowest unoccupied molecular orbital, the first highest occupied molecular orbital being lower than the third highest occupied molecular orbital, the second lowest unoccupied molecular orbital being higher than the third lowest unoccupied molecular orbital, the absolute value of a difference between the third highest occupied molecular orbital and the third lowest unoccupied molecular orbital being less than the absolute value of a difference between the second highest occupied molecular orbital and the third lowest unoccupied molecular orbital and less than the absolute value of a difference between the third highest occupied molecular orbital and the first lowest unoccupied molecular orbital, wherein the plurality of particles includes at least one selected from the group consisting of PbS, PbSe, $Bi_2O_3$, and $Bi_2S_3$.

5. The detector according to claim 1, wherein a diameter of at least a portion of the plurality of particles is not less than 1 nanometer and not more than 100 nanometers.

6. The detector according to claim 1, wherein a thickness of the intermediate layer along a first direction is not less than 1 micrometer and not more than 1000 micrometers, and the first direction is from the second conductive layer toward the first conductive layer.

7. A radiation detector, comprising:

a first conductive layer;

a second conductive layer;

an intermediate layer provided between the first conductive layer and the second conductive layer, the intermediate layer including an organic semiconductor region and a plurality of particles, the organic semiconductor region including a portion provided around the particles, the organic semiconductor region including a first semiconductor region and a second semiconductor region, the first semiconductor region having a first highest occupied molecular orbital and a first lowest unoccupied molecular orbital, the second semiconductor region having a second highest occupied molecular orbital and a second lowest unoccupied molecular orbital, the particles having a third highest occupied molecular orbital and a third lowest unoccupied molecular orbital, the first highest occupied molecular orbital being lower than the third highest occupied molecular orbital, the second lowest unoccupied molecular orbital being higher than the third lowest unoccupied molecular orbital, the absolute value of a difference between the third highest occupied molecular orbital and the third lowest unoccupied molecular orbital being less than the absolute value of a difference between the second highest occupied molecular orbital and the third lowest unoccupied molecular orbital and less than the absolute value of a difference between the third highest occupied molecular orbital and the first lowest unoccupied molecular orbital; and a detection circuit electrically connected to the first conductive layer and the second conductive layer, the detection circuit outputting a signal corresponding to an intensity of radiation incident on a stacked body, the stacked body including the first conductive layer, the second conductive layer, and the intermediate layer.

8. The detector according to claim 7, wherein the radiation includes β-rays.

* * * * *